(12) United States Patent
Chen et al.

(10) Patent No.: US 6,664,611 B2
(45) Date of Patent: Dec. 16, 2003

(54) COMPOSITION AND METHOD FOR CLEANING RESIDUAL DEBRIS FROM SEMICONDUCTOR SURFACES

(75) Inventors: Gary Chen, Boise, ID (US); Li Li, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/058,357

(22) Filed: Jan. 30, 2002

(65) Prior Publication Data

US 2002/0137357 A1 Sep. 26, 2002

Related U.S. Application Data

(62) Division of application No. 09/730,769, filed on Dec. 7, 2000, now Pat. No. 6,391,794.

(51) Int. Cl.[7] .................................. H01L 23/58
(52) U.S. Cl. ................. 257/639; 438/745; 438/636
(58) Field of Search ........................ 438/691, 745, 438/631, 636, 637, 645; 257/639

(56) References Cited

U.S. PATENT DOCUMENTS

| 5,783,495 | A | | 7/1998 | Li et al. |
|---|---|---|---|---|
| 5,962,385 | A | | 10/1999 | Maruyama et al. |
| 5,981,401 | A | | 11/1999 | Torek et al. |
| 6,044,851 | A | * | 4/2000 | Grieger et al. ............ 134/1.3 |
| 6,103,634 | A | | 8/2000 | Dunton |
| 6,147,002 | A | * | 11/2000 | Kneer .................. 438/692 |
| 6,200,909 | B1 | | 3/2001 | Torek et al. |
| 6,265,309 | B1 | * | 7/2001 | Gotoh et al. ............ 438/637 |
| 6,319,835 | B1 | | 11/2001 | Sahbari et al. |

* cited by examiner

Primary Examiner—David Nelms
Assistant Examiner—Quoc Hoang
(74) Attorney, Agent, or Firm—Dickstein Shapiro Morin & Oshinsky LLP

(57) ABSTRACT

A method for removing a dielectric anti-reflective coating (DARC) of silicon oxynitride material from a layer of insulative material which is formed over a substrate in a semiconductor device involves contacting the DARC material with a mixture of tetramethylammonium fluoride and at least one acid such as hydrofluoric acid, hydrochloric acid, nitric acid, phosphoric acid, acetic acid, citric acid, sulfuric acid, carbonic acid or ethylenediamine tetraacetic acid. Contact with the mixture is for a time period sufficient to remove substantially all of the DARC material. The mixture has a high etch rate selectivity such that the DARC coating can be removed with minimal effect on the underlying insulative layer.

18 Claims, 4 Drawing Sheets

COMPOSITION AND METHOD FOR CLEANING RESIDUAL DEBRIS FROM SEMICONDUCTOR SURFACES

This application is a divisional of application Ser. No. 09/730,769, filed on Dec. 7, 2000 now U.S. Pat. No. 6,391,794, which is hereby incorporated by reference.

FIELD OF THE INVENTION

The present invention relates to cleaning residual contaminants from semiconductor devices, and more particularly, to a new composition and method for etch removal of undesirable materials from areas near contact openings on wafer surfaces. The invention also relates to the semiconductor structures cleaned in accordance with the formulation and method hereinafter described.

BACKGROUND OF THE INVENTION

In the formation of contact openings or vias in semiconductor devices used to provide conductor-to-conductor contacts, it is often necessary to etch through one or more layers of insulative material formed over a substrate. FIG. 1 shows a cross section of a portion of a semiconductor device 10 in an intermediate stage of fabrication. The device has a substrate 12. The substrate is formed of a material such as silicon. Field oxide regions 13, transistor gate stacks 15, spacers 17 protecting the gate stacks, and doped regions 19 are formed over the substrate. The substrate 12 also has at least one conductive area in the form of a conductive "plug" 21, e.g. a polysilicon plug, formed thereover which has been deposited through a first layer of insulating material 23, which is usually a type of glass oxide available in the art, for example, Boro-Phospho-Silicate Glass (BPSG), or silicon oxide material such as silicon dioxide or Tetraethylorthosilicate (TEOS). The first layer of insulating material 23 may, in actuality, be formed as one or more layers of insulating material of, for example, BPSG or TEOS. The insulating layer 23 may be anywhere from a few hundred Angstroms to several thousand Angstroms in thickness. The top of layer 23 and the top of plug 21 may also be substantially coplanarized using available methods.

As shown in FIG. 2, a second insulative layer 25 is formed over the first insulative layer 23. The second insulative layer 25 may be comprised of the same or different material than that of the first insulative layer 23, and can also comprise BPSG, for example. A dielectric anti-reflective coating (DARC) layer 27 is formed over the second insulative layer 25 using available methods. The DARC layer 27 is typically comprised of silicon oxynitride and may be a few Angstroms to several hundred Angstroms in thickness. A photoresist layer 29 is patterned over the DARC layer 27 to provide access to the conductive plug 21 as represented by the dotted lines in FIG. 2.

Referring now to FIG. 3, a contact opening 31 is formed through the DARC layer 27 and the second insulative layer 25. The contact opening 31 is preferably formed using available etching methods, in particular dry etching using one or more available fluorinated hydrocarbons that are exposed to acceptable operating parameters. The etch stop is preferably the top of the conductive plug 21. The DARC layer 27 prevents the photoresist layer 29 from being exposed to light which is otherwise reflected off the insulative layer 25, which during the developing of photoresist layer 29 causes it to have an incorrect opening for etching.

As shown in FIG. 4, after formation of the contact opening 31 the photoresist layer may be stripped using available methods. Removal of the photoresist layer leaves the exposed DARC layer 27 over the second insulative layer 25 which must also be removed. The DARC layer 27, comprised of silicon oxynitride, and although a solid dielectric layer it has a tendency to leak at times, and may therefore interfere with subsequent metallization of the contact opening 31, e.g. metallization during capacitor formation. Its removal is therefore highly desirable. At the same, it is also desirable to remove this layer with minimal effect on the second insulating layer 25, e.g. with minimal or no removal of layer 25.

To date, removal of the DARC layer 27 has been achieved using chemical formulations that have included such compounds as ammonia fluoride ($NH_4F$) mixed with phosphoric acid ($H_3PO_4$). One reference, U.S. Pat. No. 5,981,401 to Torek et al. describes a method for selective etching of antireflective coatings. However, this document only discloses etch ratios that are greater than 1 or 2. This would indicate that the underlying insulative layer is still being etched at a rather high rate relative to the di-electric anti-reflective coating layer. In addition, the patentees recommend etchant solutions with very high (basic) pH's to achieve etch rates greater than 1. They disclose pH's which exceed 11, and desirably are between 11 and 14.

Unfortunately, none of the compositions or methods available in the art have been totally satisfactory in removing the DARC layer, while minimally affecting the underlying insulative layer. Some have been too weakly formulated so that the DARC layer is not adequately removed; others have been too strong or corrosive such that a significant portion of the insulative material is removed as well.

Thus, there exists a need in the art for an improved formulation and method for removing dielectric anti-reflective coating (DARC) layers, as well as other residual debris that may be formed during other stages of semiconductor fabrication, such as during formation of contact openings.

SUMMARY OF THE INVENTION

In accordance with the invention, there is set forth a method of removing a dielectric anti-reflective coating comprising contacting the coating with a removal mixture containing tetramethylammonium fluoride and at least one acid selected from the group consisting of hydrofluoric acid, hydrochloric acid, nitric acid, phosphoric acid, acetic acid, citric acid, sulfuric acid, carbonic acid and ethylenediamine tetraacetic acid.

In a further embodiment of the invention a composition suitable for use in removing a silicon oxynitride dielectric anti-reflective coating is provided. The composition comprises about 10 to about 40% of tetramethylammonium fluoride; and about 0.15 to about 6% of at least one acid selected from the group consisting of hydrofluoric acid, hydrochloric acid, nitric acid, phosphoric acid, acetic acid, citric acid, sulfuric acid, carbonic acid and ethylenediamine tetraacetic acid. The composition may also contain from about 1 to about 15% of an oxidizing agent such hydrogen peroxide, ozone, or ammonium persulfate.

The invention also provides a method of removing silicon oxynitride material by contacting it with a mixture of tetramethylammonium fluoride and at least one acid selected from the group consisting of hydrofluoric acid, hydrochloric acid, nitric acid, phosphoric acid, acetic acid, citric acid, sulfuric acid, carbonic acid and ethylenediamine tetraacetic acid. The contacting is performed at a temperature within the range of about 10 degrees C. to about 70 degrees C.

Further provided as part of the invention is a method of forming a contact opening in an insulative layer formed over a substrate in a semiconductor device. The method comprises forming a dielectric antireflective coating layer over the insulative layer, and then forming a photoresist layer over the coating layer. The photoresist layer is patterned and exposed to provide an etch mask. A contact opening is then etched through the insulative layer using the etch mask. The photoresist layer is then removed, and the coating layer is contacted with a removal mixture containing tetramethylammonium fluoride and at least one acid selected from the group consisting of hydrofluoric acid, hydrochloric acid, nitric acid, phosphoric acid, acetic acid, citric acid, sulfuric acid, carbonic acid and ethylenediamine tetraacetic acid, with the contacting being sufficient to remove the coating layer.

In addition, the invention provides a method of chemical mechanical planarization. A top portion of a conductive plug is planarized with a top portion of an insulative layer formed over a substrate in a semiconductor device. At least one of the top portions is then contacted with a mixture of tetramethylammonium fluoride and at least one acid selected from the group consisting of hydrofluoric acid, hydrochloric acid, nitric acid, phosphoric acid, acetic acid, citric acid, sulfuric acid, carbonic acid and ethylenediamine tetraacetic acid.

The invention further provides a semiconductor device having a substrate, and a contact opening formed in an insulative layer over the substrate, wherein at least the contact opening or the portion of the insulative layer around the contact opening, and preferably both regions, have been cleaned with a mixture of tetramethylammonium fluoride and at least one acid selected from the group consisting of hydrofluoric acid, hydrochloric acid, nitric acid, phosphoric acid, acetic acid, citric acid, sulfuric acid, carbonic acid and ethylenediamine tetraacetic acid.

Additional advantages and features of the present invention will become more readily apparent from the following detailed description and drawings which illustrate various exemplary embodiments of the invention.

DETAILED DESCRIPTION OF THE PREFERRED EMBODIMENTS

In one embodiment, the invention relates to a method of removing a dielectric anti-reflective coating from an insulative layer.

Reference herein shall be made to the terms "substrate" and "wafer", which are to be understood as including silicon, a silicon-on-insulator (SOI) or silicon-on-sapphire (SOS) structures, doped and undoped semiconductives, epitaxial layers of silicon supported by a base semiconductive foundation, and other semiconductive structures. In addition, when reference is made to a "substrate" or "wafer" in the following description, previous process steps may have been utilized to form arrays, regions or junctions in or over the base semiconductive structure or foundation. In addition, the semiconductive material need not be silicon-based, but could be based on silicon-germanium, germanium, indium phosphide, or gallium arsenide. The term "substrate" as used herein may also refer to any type of generic base or foundation structure.

Figure 4:
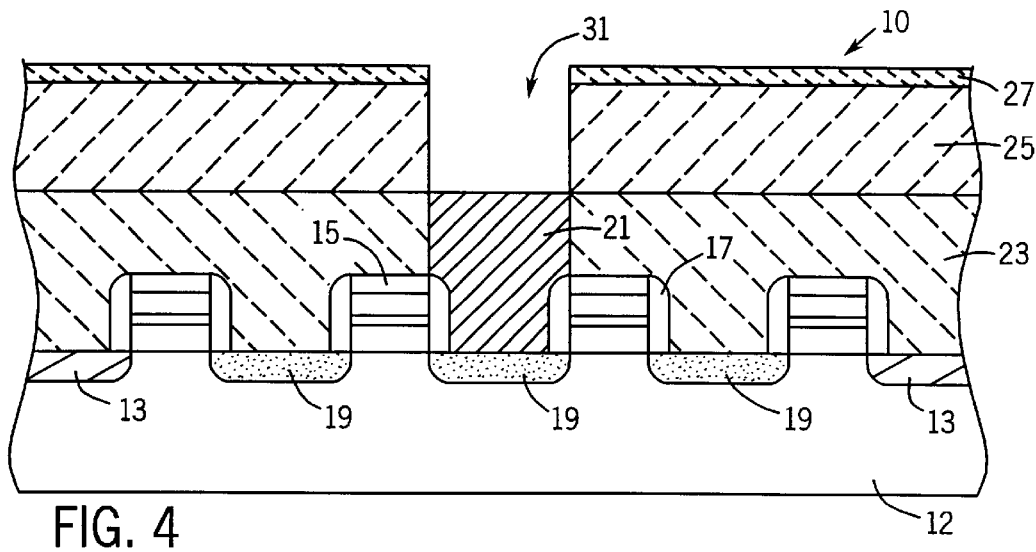
FIG. 4 is the device shown in FIG. 3 in a further stage of fabrication.
Figure 5:
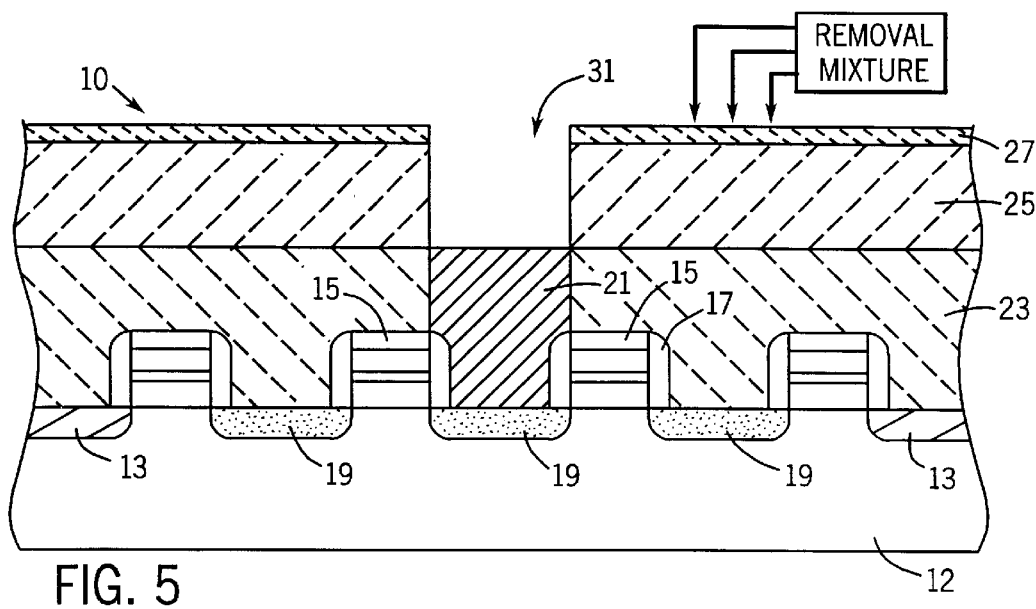
FIG. 5 is the device shown in FIG. 4 utilizing the composition and method of the invention to remove a DARC layer.

Referring again to the drawings with reference now to FIG. 5, after the etching of the insulative layer 25 illustrated in FIG. 4, the DARC layer 27 is contacted with a mixture of tetramethylammonium fluoride $(CH_3)_4NF$ (TMAF) and at least one acid selected from the group consisting of hydrofluoric acid, hydrochloric acid, nitric acid, phosphoric acid, acetic acid, citric acid, sulfuric acid, carbonic acid and ethylenediamine tetraacetic acid (EDTA). This mixture of TMAF and acid may be referred to herein as a removal mixture. Preferably, the removal mixture comprises about 10 to about 40% of TMAF, and more preferably contains about 20 to about 25% thereof. Even more desirably, the mixture will contain about 21 to about 24% of tetramethylammonium fluoride (unless otherwise stated, all percentages herein are weight percentages). Besides TMAF, other compounds with the formula $R_4NF$ may be utilized in the removal mixture, where R is a straight or branched chain $C_1-C_{20}$ alkyl group. (When TMAF is utilized, it may be obtained as a stock solution containing about 25 wt % of TMAF; however, other formulations are also within the scope of the invention.)

The acid will be present in the removal mixture in amounts of from about 0.15 to about 5%, with amounts within the range of about 0.3 to about 1% being more preferred. Especially preferred is an amount of acid in the removal mixture within the range of about 0.5 to about 1%. The remainder of the removal mixture is typically water in a quantity sufficient to obtain 100 total weight percent.

Preferably, the acid is at least one member selected from the group consisting of hydrofluoric, phosphoric and acetic acids. Of these, hydrofluoric acid is particularly desirable. Thus, a removal mixture comprising tetramethylammonium fluoride (TMAF) and hydrofluoric acid is particularly preferred. When hydrofluoric acid is utilized, it is usually obtained as a 49 wt. % solution; however, other suitable and generally available concentrations are also within the scope of the invention. Other desirable formulations include TMAF with phosphoric acid, as well as TMAF with acetic acid. Especially preferred, non-limiting formulations include TMAF (about 20–25%, more preferably about 23%) with about 0.5 to about 1.0% of hydrofluoric acid; TMAF (about 20–25%, more preferably about 23%) with about 2 to about 4% of phosphoric acid; and TMAF (about 20–25%, more preferably about 23%) with about 5 to about 10%, preferably about 7% of acetic acid.

In a further embodiment of the invention, the tetramethylammonium fluoride (TMAF) may be generated from a reaction mixture of tetramethylammonium hydroxide (TMAH) and hydrofluoric acid (HF) according to the following reaction scheme:

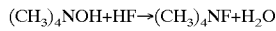

The TMAF is then further admixed with one or more of the acids set forth above. If the acid selected is hydrofluoric acid, then it may be added in a stoichiometric excess to that necessary to generate the TMAF in the reaction scheme set forth above.

In a further embodiment of the invention, an oxidizing agent may be added to the removal mixture of TMAF and acid(s) described above. Preferably, the oxidizing agent is chosen to form an oxidizing etchant with the removal mixture so as to enhance etch rate selectivity. A suitable oxidizing agent may be one or more members selected from the group consisting of hydrogen peroxide ($H_2O_2$), ozone ($O_3$), ammonium persulfate and nitric acid. Of these, hydrogen peroxide may be preferred in many applications. When added, the oxidizing agent will comprise about 1 to about 15% of the etchant removal mixture. More preferably, the oxidizing agent will make up about 3 to about 10% thereof. An especially preferred, non-limiting etchant removal mixture will therefore comprise about 20 to about 25%, more preferably about 23% of TMAF; about 2 to about 4% of phosphoric acid; and about 1 to about 10%, preferably about 3% of hydrogen peroxide.

In a preferred embodiment of the invention, the combination of TMAF and acid chosen (plus any additional components, e.g. oxidizing agent(s)) is such that an etch rate selectivity ratio of at least about 5:1, and more preferably at least about 10:1 is obtained. Especially preferred is an etch rate selectivity ratio of at least about 15:1. As that term is used herein, "etch rate selectivity ratio" means the rate at which the DARC layer 27 is etched relative to the rate at which the insulating material, e.g. BPSG or TEOS comprising the underlying insulative layer 25, is etched (etch rate being typically measured in Angstroms/minute). For an etch rate selectivity of about 5:1, this means that the removal mixture will etch the DARC layer 27 about 5 times faster than the underlying insulative layer 25. Thus, the combination of TMAF and acid(s) chosen should maximize removal of the DARC layer 27, while minimally abrading the underlying insulative layer 25. Conversely, it is particularly preferred that the combination of TMAF and acid chosen be such that TMAF's utility at reducing the etch rate of the insulative layer, e.g. BPSG or TEOS, be maximized, while at the same time maintaining the relatively high ionic strength of the fluoride ion useful in removing silicon oxynitride polymers and other residual debris.

In another embodiment of the invention, the removal mixture may have a pH within the range of about 4 to about 14, and desirably may have a substantially neutral pH which is within the range of about 6.5 to about 8.5. More preferably, the pH of the solution is within the range of about 7 to about 8, and is more preferably about 7. Etch rate selectivities as described above can still be obtained within these pH ranges, with the additional advantage being that the removal mixture is not overly caustic or corrosive.

The removal mixture according to its various embodiments should be storage stable for at least about 24 hours, and more preferably for at least about 1 week. As that term is used herein, "storage stable" means that the removal mixture should retain at least about 90% potency after storage at 25 degrees C. and about 1 atmosphere pressure for the stated periods.

Removal of the DARC layer 27 can be usually be accomplished at temperatures within the range of about 10 to about 70 degrees Celsius, with about 20 to about 60 degrees being more preferred, and with temperatures of about 20 to about 40 degrees being even more desirable. It has now been found that as a general rule, the higher the operating temperature, the faster the rate of DARC layer removal, but the lower the etch rate selectivity ratio.

Removal is preferably accomplished by dipping the portion of the semiconductor device containing the DARC layer 27 in a bath containing the removal mixture of TMAF and acid(s) described above. The contacting is performed for a time sufficient to remove at least most of, and preferably substantially all of the DARC layer 27. The time for contacting the DARC layer 27 with the TMAF/acid mixture will vary, depending upon such factors as the thickness of the layer and the etch rate selectivity. In most instances, however, the time period for contacting will usually be within the range of about a few minutes to about several minutes. Thus, the time period will typically be about 3 minutes to about 15 minutes, with about 4 to about 6 minutes being preferred.

Figure 5A:
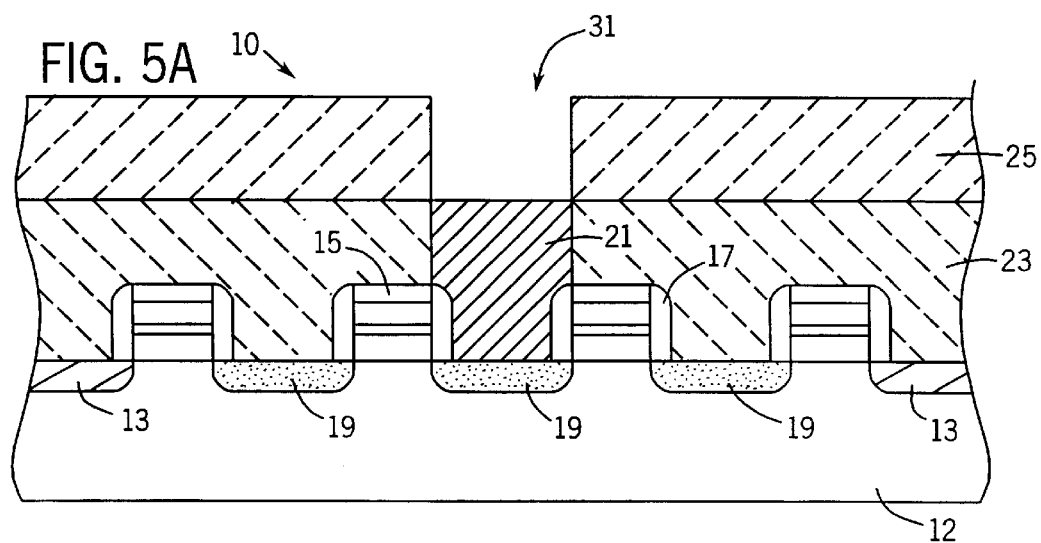
FIG. 5A is the device shown in FIG. 5 after the DARC layer has been removed.

FIG. 5A illustrates the portion of the semiconductor device 10 in which the DARC layer 27 has been removed using the composition and method of the invention. Both the layer 27 and the opening 31 are shown clear of residual debris.

Figure 1:
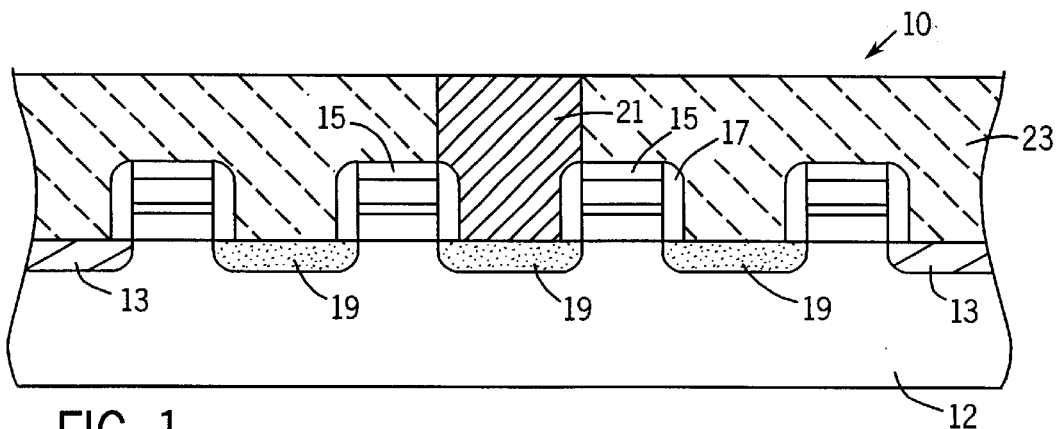
FIG. 1 is a cross section of a semiconductive wafer device in an intermediate stage of fabrication according to a first embodiment of the invention.
Figure 2:
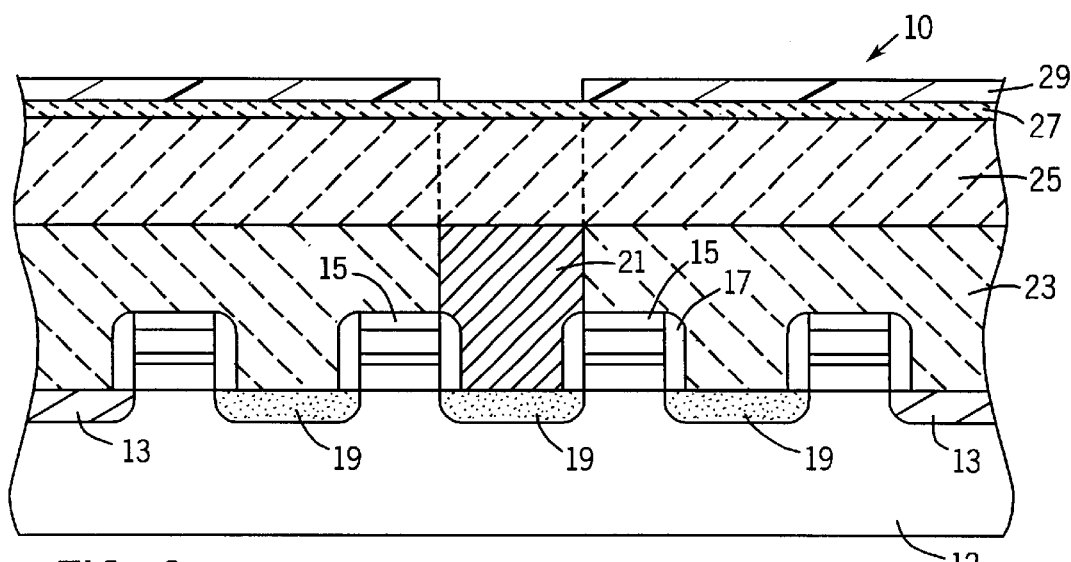
FIG. 2 is the device shown in FIG. 1 in a further stage of fabrication.
Figure 3:
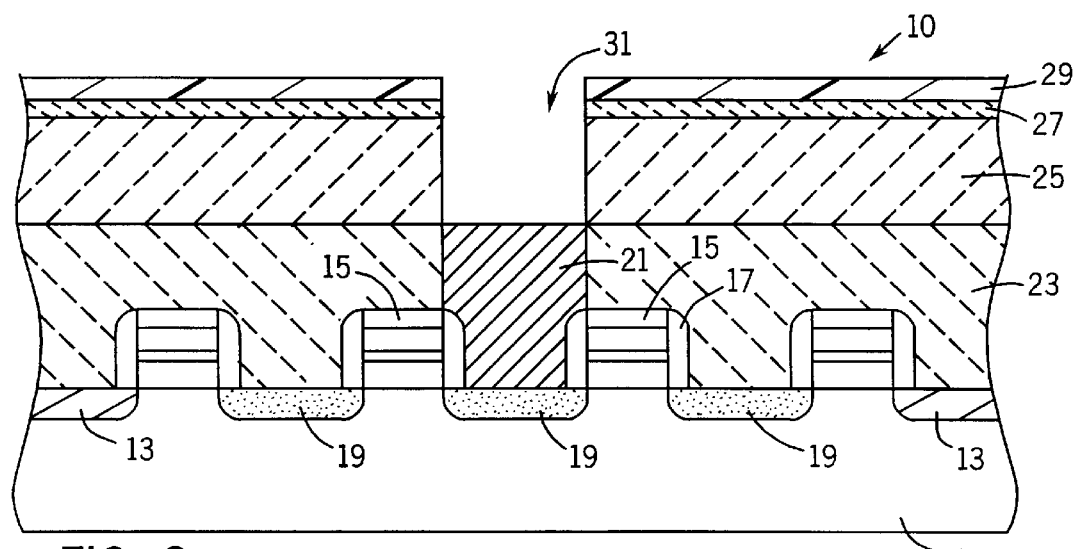
FIG. 3 is the device shown in FIG. 2 in a further stage of fabrication.
Figure 6:
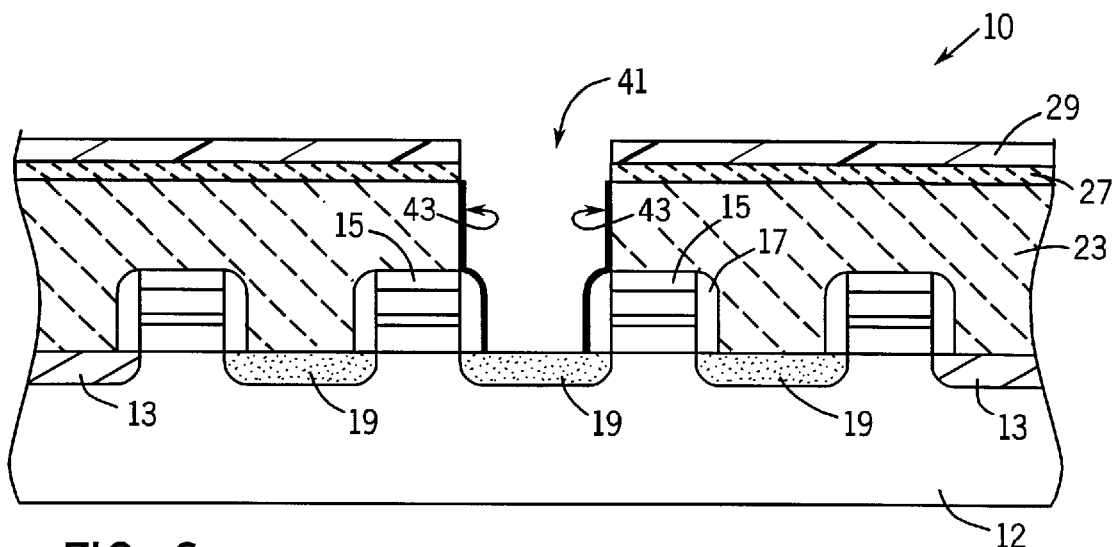
FIG. 6 is another cross section of a semiconductive wafer device in an intermediate stage of fabrication according to another embodiment of the invention
Figure 7:
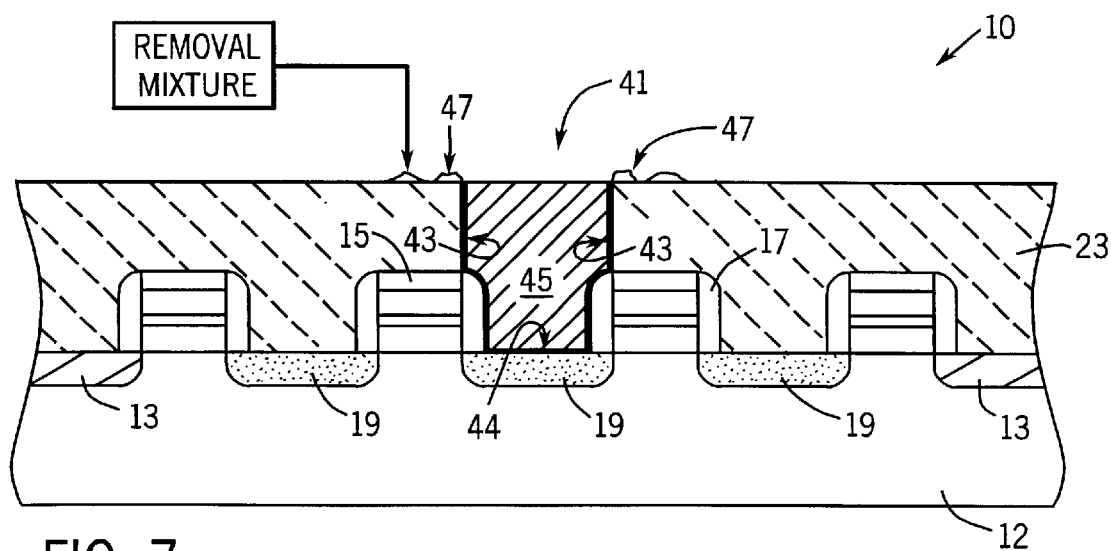
FIG. 7 is the device shown in FIG. 6 in a further stage of fabrication.

Referring now to FIGS. 6 and 7, there is shown a further embodiment of the invention on another portion of the semiconductor device 10 shown in FIG. 1. Another contact opening 41 may be formed in the insulative layer 23 using available methods, including utilization of a DARC layer 27 and a photoresist layer 29 as heretofore described with reference to FIGS. 1 through 4. Subsequent to removal of both the DARC layer and the photoresist layer using available methods and following formation of a doped region 19 using applied chemical vapor deposition (CVD) techniques, for example, the inside of the opening 41 may be contacted with titanium so as to form a thin conductive coating 43 thereover. A thin layer 44 of titanium nitride may also be formed or deposited at the bottom of the contact opening 41 over the doped region 19 of the substrate 12.

Figure 8:
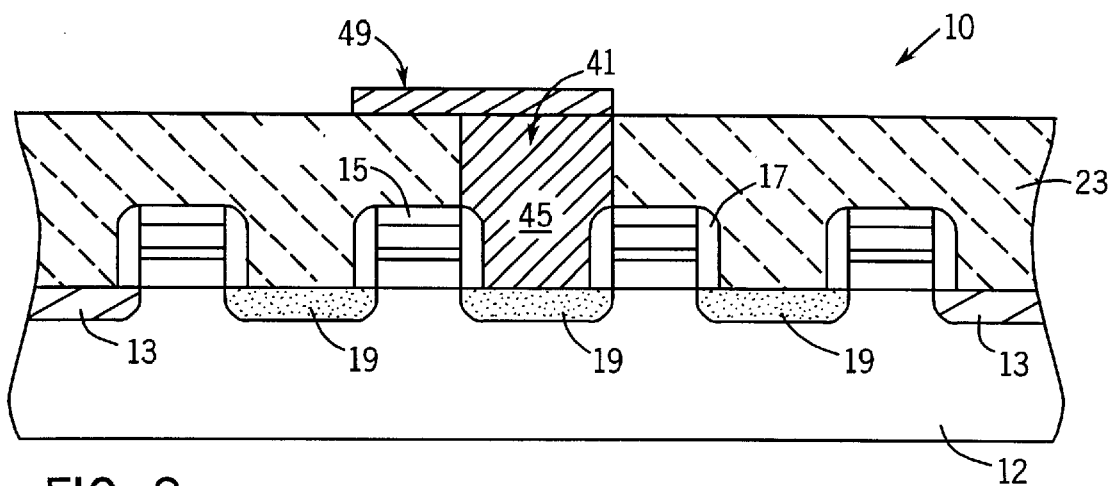
FIG. 8 is the device shown in FIG. 7 in a further stage of fabrication.

Referring to FIGS. 7 and 8, a tungsten plug 45 may then be formed in the contact opening 41. The conductive coating of titanium 43 helps the plug 45 to better adhere within the insulative layer 23, and when annealed with nitrogen during a rapid thermal process, actually forms two conductive material layers of titanium nitride and titanium silicide. The titanium silicide layer reduces the plug resistance, and together with the titanium nitride layer (shown as component 44) helps to prevent ions from penetrating into the substrate during plug formation. Thereafter, the top of the plug 45 and the insulative layer 23 may be coplanarized using techniques such as chemical mechanical planarization, or CMP.

In theory, planarization should remove any residual titanium and/or titanium nitride which may have built up over the insulative layer 23 around the opening 41, as well as any residual DARC layer material remaining thereover as well. In practice, however, residual contaminants at the corner regions 47 illustrated in FIG. 7 remain, which can interfere with the subsequent formation of a conductive metal runner 49 over the plug 45 (as shown in FIG. 8). These residual contaminants can also interfere with the electrical connection between the runner 49 and the plug 45. Thus, the composition and method of the invention as heretofore described can be useful in removing residual titanium/titanium nitride and DARC material (silicon oxynitrides) from the region 47 around the opening 41. Preferably this is accomplished by dipping as heretofore described, after planarization of the plug 45 with the top of layer 23 and before formation of the conductive metal runner 49.

EXAMPLE

The following example illustrates various embodiments of the invention, but should not be construed as limiting the scope thereof. In this example, etch rates (Angstroms/minute) for various formulations of the invention were compared on BPSG, TEOS and DARC layers. The results are shown in TABLE 1:

| Formulation | BPSG | TEOS | DARC |
|---|---|---|---|
| 23% TMAF, 0.5% HF (21.5° C.) | 11.9 | 29.0 | 164.0 |
| 23% TMAF, 1.0% HF (21.5° C.) | 19.3 | 47.9 | 228.2 |
| 23% TMAF, 4% H$_3$PO$_4$ (23° C.) | 19.9 | 54.0 | 1 KÅ clear in 3 minutes |
| 23% TMAF, H$_3$PO$_4$, 3% H$_2$O$_2$ (23° C.) | 24.3 | 728 | 1 KÅ clear in 2 minutes |
| 23% TMAF, 7% acetic acid (36.8° C.) | 59.3 | 164.0 | 1 KÅ clear in 1 minute |
| Same as above (27.9° C.) | 32.0 | 82.9 | 1 KÅ clear in 2 minutes |
| Same as above (25° C.) | 248 | 66.7 | 1 KÅ clear in 2.5–3 minutes |
| Same as above (21.5° C.) | 20.0 | 50.9 | 254 |

As is shown in TABLE 1, the formulation according to various embodiments of the invention exhibits high etch rate selectivity ratios for the DARC layer relative to an insulative layer comprised of either BPSG or TEOS.

Figure 9:
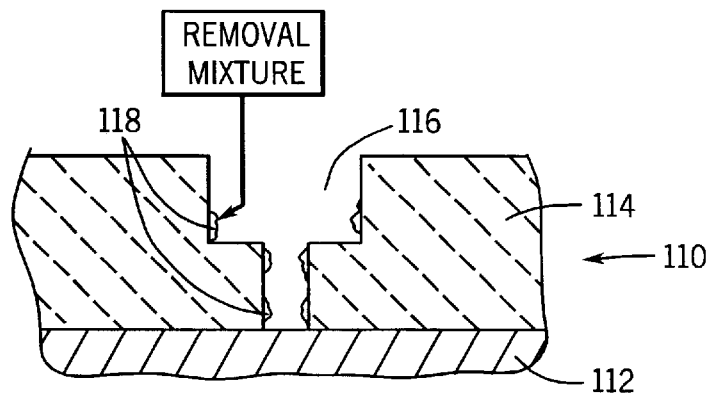
FIG. 9 is another cross section of a semiconductor wafer device in an intermediate stage of fabrication according to another embodiment of the invention.

A further application of the method and composition of the invention is illustrated with respect to FIG. 9. A semiconductor device 110 in an intermediate stage of fabrication has a base or substrate 112 which is preferably comprised of a conductive material such as one or more metals, and even more preferably is formed of copper. A dielectric or insulative layer 114 has been formed over the substrate 112 using available methods and may be comprised of a material such as BPSG or TEOS, for example. A trench or via 116 has also been formed in the dielectric layer 114. The shape of the trench or via 116 in FIG. 9 is shown for purposes of illustration only, and is not to be construed as limiting. Trench or via 116 is formed using methods such as dry etching with available etch compounds. Metallic debris 118 is sputtered or otherwise deposited on the sides of the trench or via 116 as a result of the etch materials contacting the substrate 112. Use of the removal mixture of the invention according to the various embodiments as heretofore described will effectively remove the debris 118 while not corroding either the dielectric layer 114 or the substrate 112.

Figure 10:
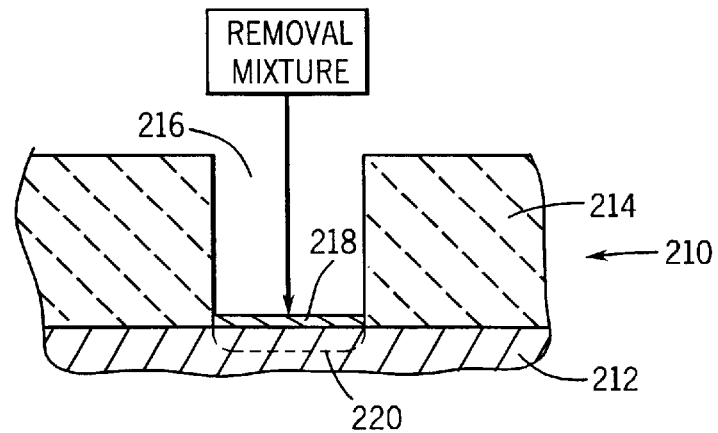
FIG. 10 is another cross section of a semiconductor wafer device in an intermediate stage of fabrication according to another embodiment of the invention.

Another application of the invention is shown with respect to FIG. 10. A semiconductor device 210 in an intermediate stage of fabrication has an opening 216 formed in an insulative layer 214 which in turn has been formed over a substrate 212. The substrate is comprised of silicon, or silicon-on-insulator material as previously described with reference to FIG. 1. A layer of native oxide 218 has been deposited in the opening 216 over the substrate 212 using available materials and techniques. Subsequent removal of the native oxide layer 218 is desirable as part of a pre-diffusion cleaning step. In this process, the native oxide layer 218 is removed from the substrate so that dopants may then be diffused into the substrate to form an active, doped region as illustrated by the line 220. Use of the removal mixture of the invention as heretofore described will effectively remove the native oxide 118 while not corroding either the insulative layer 214 or the substrate 212.

The foregoing description is illustrative of exemplary embodiments which achieve the objects, features and advantages of the present invention. It should be apparent that many changes, modifications, substitutions may be made to the described embodiments without departing from the spirit or scope of the invention. The invention is not to be considered as limited by the foregoing description or embodiments, but is only limited by the scope of the appended claims.

What is claimed as new and desired to be protected by Letters Patent of the United States is:

1. A semiconductor device, comprising:
    a substrate; and
    a contact opening formed in an insulative layer over said substrate, wherein at least one of said contact opening and a portion of the insulative layer around said contact opening has been cleaned with a mixture of tetramethylammonium fluoride, an oxidizing agent and at least one acid selected from the group consisting of hydrofluroic acid, hydrochloric acid, nitric acid, phosphoric acid, acetic acid, citric acid, sulfuric acid, carbonic acid and ethylenediamine tetraacetic acid.

2. The device of claim 1, wherein said device has a conductive plug formed in said contact opening after said cleaning.

3. The semiconductor device of claim 1 wherein said oxidizing agent is present in an amount of from about 1 to about 15%.

4. A composition suitable for use in removing a silicon oxynitride dielectric anti-reflective coating, comprising:
    about 10 to about 40% of tetramethylammonium fluoride; and
    about 0.15 to about 6% of at least one acid selected from the group consisting of hydrofluoric acid, hydrochloric acid, nitric acid, phosphoric acid, acetic acid, citric acid, sulfuric acid, carbonic acid and ethylenediamine tetraacetic acid.

5. The composition of claim 4, wherein said composition comprises about 20 to about 25% of tetramethylammonium fluoride.

6. The composition of claim 4, wherein said acid is selected from the group consisting of hydrofluoric acid, nitric acid and phosphoric acid.

7. The composition of claim 6, wherein said acid comprises about 0.3 to about 1% of said composition.

8. The composition of claim 7, wherein said acid comprises about 0.5 to about 1% of said composition.

9. The composition of claim 4, further comprising at least one oxidizing agent.

10. The composition of claim 9, wherein said oxidizing agent is at least one member selected from the group consisting of hydrogen peroxide (H$_2$O$_2$), ozone (O$_3$), ammonium persulfate and nitric acid.

11. The composition of claim 10, wherein said oxidizing agent is hydrogen peroxide.

12. The composition of claim 9, wherein said oxidizing agent comprises about 1 to about 15% of said composition.

13. The composition of claim 4, wherein said composition has an etch rate selectivity ratio of at least about 5:1.

14. The composition of claim 13, wherein said composition has an etch rate selectivity ratio of at least about 10:1.

15. The composition of claim 4, wherein said composition is storage stable for at least about 24 hours.

16. The composition of claim 4, wherein said composition is storage stable for at least about one week.

17. The composition of claim 4, wherein said composition has a substantially neutral pH.

18. The composition of claim 17, wherein said composition has a pH within the range of about 7 to about 8.

* * * * *